(12) United States Patent
Sankarapillai et al.

(10) Patent No.: US 7,381,629 B2
(45) Date of Patent: Jun. 3, 2008

(54) METHOD OF FORMING THROUGH-WAFER INTERCONNECTS FOR VERTICAL WAFER LEVEL PACKAGING

(75) Inventors: Chirayarikathuveedu Premachandran Sankarapillai, Singapore (SG); Ranganathan Nagarajan, Singapore (SG); Mohanraj Soundarapandian, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 11/705,480

(22) Filed: Feb. 12, 2007

(65) Prior Publication Data

US 2007/0141804 A1 Jun. 21, 2007

Related U.S. Application Data

(63) Continuation-in-part of application No. 10/925,683, filed on Aug. 25, 2004, now Pat. No. 7,183,176.

(51) Int. Cl.
*H01L 21/46* (2006.01)

(52) U.S. Cl. ............................. 438/458; 257/E21.568; 257/E21.57

(58) Field of Classification Search ................ 438/458; 257/E21.568, E21.57
See application file for complete search history.

(56) References Cited

U.S. PATENT DOCUMENTS

| | | | |
|---|---|---|---|
| 6,878,608 B2 * | 4/2005 | Brofman et al. ............ | 438/459 |
| 7,183,176 B2 * | 2/2007 | Sankarapillai et al. ...... | 438/458 |
| 2006/0051935 A1 * | 3/2006 | Silverbrook ................ | 438/458 |

OTHER PUBLICATIONS

"Wafer-Level Membrane Transfer Bonding of Polycrystalline Silicon Bolometers for Use in Infrared Focal Plane Arrays," by Frank Niklaus et al., 2001 IOP Pub. Ltd., *Jrnl of Micro-Mechanics & Microengineering*, 11 (2001)509-513.
"A Novel Electrically Conductive Wafer Through Hole Filled Vias Interconnect for 3D MEMS Packaging," by C.S. Premachandran et al., *2003 Elec. Components and Tech. Conf.*, 2003 IEEE, pp. 627-630.
"Through-Wafer Copper Electroplating for Three-Dimensional Interconnects," by N.T. Nguyen et al., 2002 IOP Pub. Ltd., *Jrnl. of Micromechanics and Microengineering* 12(2002) pp. 395-399.
"A new transferred ultra-thin silicon micro-packaging", by Jen-Yi Chan et al., Jrnl. of. Micromechanics & Microengineering, 12 (2002), pp. 406-409, Institute of Physics Publishing, (c) 2002 IOP Publishing Ltd.

* cited by examiner

*Primary Examiner*—Fernando L. Toledo
(74) *Attorney, Agent, or Firm*—Saile Ackerman LLC; Stephen B. Ackerman; Rosemary L. S. Pike

(57) ABSTRACT

A substrate having target transfer regions thereon is provided. A sacrificial wafer is coated with a polymer layer with low adhesion to metals. A conductive layer is coated on the polymer layer and covered with a photoresist layer which is patterned to provide openings to the conductive layer. Thin film and passive or active device structures are formed on the conductive layer within the openings. The substrate is bonded to the sacrificial wafer wherein the thin film and passive or active device structures and the photoresist layer provide the bonding and wherein the thin film and passive or active device structures contact the substrate at the target transfer regions. The photoresist is stripped in a high frequency agitation bath wherein the photoresist separates from the sacrificial wafer and wherein the thin film and passive or active device structures separate from the polymer layer to complete transfer bonding.

12 Claims, 6 Drawing Sheets

METHOD OF FORMING THROUGH-WAFER INTERCONNECTS FOR VERTICAL WAFER LEVEL PACKAGING

This is a Divisional application of U.S. patent application Ser. No. 10/925,683, filed on Aug. 25, 2004 now U.S. Pat. No. 7,183,176, which is herein incorporated by reference in its entirety and assigned to a common assignee.

BACKGROUND OF THE INVENTION (1) Field of the Invention

This invention relates generally to vertically stacked wafer level packaging of silicon device wafers . . . More particularly it relates to the process used for separating two or more bonded wafers for various applications like fabrication of through-hole interconnected substrates, 3D stacked wafer level packaging, transfer of films or device structures by transfer-bonding, etc.

(2) Description of the Prior Art

Modular systems packaging applications are increasingly in demand as more and more devices with different applications are integrated together. High density and high speed transmission are additional requirements for future products. Multi chip module (MCM) is one of the methods in which different devices can be integrated together in a 2D approach. However, the final assembly is larger in size and miniaturization is limited. Since the size of the product is shrinking and, at the same time, more functions are integrated, the MCM approach is not a viable solution for the next generation microsystem packaging. Product shrinking has become like a natural phenomenon and the challenge ahead is how to make the package size smaller, but with higher performance while meeting reliability requirements.

Integrating devices in a vertical fashion can reduce the real estate of the total package. 3D integration can be achieved by stacking the packages or by stacking the dies or by stacking the wafers. An easy way of realizing this approach is by stacking the chips one over the other and wire bonding the chips. A conventional method of interconnecting the stacked chips is by side wall contacts with metallization. In the above approach, the assembly is done at chip level and assembly cost is high due to chip processing.

Vertical integration of wafers is based on thinning, bonding, and interconnecting the wafer by through-hole filled vias. Through-wafer vias are typically intended for providing interconnects between both sides of wafers with microdevices and are fabricated using wafer level packaging (WLP). Current packaging trends show that vertical interconnects are favored because of space efficiency, design simplicity, heterogeneous integration, and low parasitic capacitance and impedance.

In the prior art, the article entitled "Through-wafer copper electroplating for three-dimensional ICs" by N. T. Nguyen et al, Institute of Physics Publishing, *Journal of Micromechanics and Microengineering*, c. 2002, pp. 395-399, proposes a method using wafer to wafer bonding with a photoresist layer as a bonding material to form through-wafer vias in a wafer. The wafer with through-wafer vias is first bonded to another wafer with a seed metal layer using the photoresist layer sandwiched between the seed metal layer and the wafer with through-wafer vias for the bonding. The photoresist layer exposed by the through-wafer vias is then subjected to exposure and development through the through-wafer vias to form seed areas. Once the seed areas are formed, electroplating is performed to fill the through-wafer vias using these seed areas. After the via filling, the sacrificial wafer has to be removed to separate the via-filled wafer for subsequent process integration. In this article, no method is mentioned for separating the wafer from the sacrificial wafer. Photoresist bonding cannot be removed by chemical processing methods since the vias are attached to the sacrificial wafer. One possible method could be by a conventional method such as a back grinding method. Since photoresist bonding is not uniform and the strength is poor, the wafer can break during the thinning process. In this case, the sacrificial wafer cannot be removed completely.

Another prior art article entitled "A Novel Electrically Conductive Wafer Through Hole Filled Vias Interconnect For 3D MEMS Packaging" by C. S. Premachandran et al, 2003 *Electronic Componenets and Technology Conference*, c. 2003 IEEE, pp. 627-630, gives details on the through-hole via filling with a sacrificial wafer attached to the via wafer. In this method, the sacrificial wafer is bonded to the via wafer using metal bonding by thermo-compression. Metal bonding is stronger than the photoresist bonding and will not be affected by the electroplating process. In this case the bonding integrity is good compared to resist bonding. The sacrificial wafer is removed by a wafer grinding method. In this method, wafer bonding equipment is required to bond the sacrificial wafer to the through-hole wafer. Wafer bonding equipment is expensive and carries an additional cost to the final product. Also, thermo-compression bonding happens at a higher temperature (above 350° C.) causing additional thermal stress to be applied to the wafer. Another process involved in this method is the back grinding process. It is a destructive process of physically removing the material by lapping/polishing methods. When removing the material by a back grinding method, mechanical stress is generated and transmitted to the through-hole via wafer. This poses a serious reliability issue for subsequent processes for the through-hole via wafer. A backgrinding process can also damage the sacrificial wafer if the bonding strength between the two wafers is not sufficient. This creates an earlier break or cracks on the sacrificial wafer and, subsequently, the machine stops and the further grinding process is affected. In this method, two additional processes are required increasing the cost of the final product.

Transfer bonding is discussed in the article "Wafer-level membrane transfer bonding of polycrystalline silicon bolometers for use in infrared focal plane arrays" by F. Niklaus et al, *Journal of Micromechanics and Microengineering*, 2001, p. 509-513.

SUMMARY OF THE INVENTION

A principal object of the present invention is to provide an effective and very manufacturable method of fabricating a through-wafer interconnected substrate for vertically stacked chip level and wafer level packaging of substrates with microdevices.

Another object of the invention is to provide a process for separating two or more bonded wafers.

Yet another object is to provide a process for separating two or more bonded wafers for various applications including fabrication of through-hole interconnected substrates, 3D stacked chip level or wafer level packaging, and transfer of films or device structures by transfer-bonding.

A further object of the invention is to provide a method for separating a through-hole via interconnect wafer from a sacrificial wafer to which it is bonded.

A still further object of the invention is to provide a method for separating a through-hole via wafer from a sacrificial wafer by a combination of high frequency agitation and poor adhesion of metal to an intermediate polymer layer such as lift-off polymer.

A further object of the invention is to provide a method of making through-hole via interconnections by a combination of high frequency agitation and poor adhesion of metal to an intermediate polymer layer such as lift-off polymer for vertically-stacked chip level and wafer level packaging applications.

Yet another object is to provide a method of transfer bonding of thin films and passive or active device structures to another device wafer.

A still further object is to provide a bottom-up via-fill approach to fill the through-hole vias in a wafer by means of a sacrificial wafer having a conductive layer deposited on a polymer layer such as lift-off polymer which has low adhesion to metal.

In accordance with the objects of this invention, a method of transfer bonding thin films and passive or active device structures to another substrate is achieved. A substrate having target transfer regions thereon is provided. A sacrificial wafer is coated with a polymer layer with low adhesion to metals. A conductive layer is coated on the polymer layer and covered with a photoresist layer which is patterned to provide openings to the conductive layer. Thin film and passive or active device structures are formed on the conductive layer within the openings. The substrate is bonded to the sacrificial wafer wherein the thin film and passive or active device structures and the photoresist layer provide the bonding and wherein the thin film and passive or active device structures contact the substrate at the target transfer regions. The photoresist is stripped in a high frequency agitation bath wherein the photoresist separates from the sacrificial wafer and wherein the thin film and passive or active device structures separate from the polymer layer to complete transfer bonding.

Also in accordance with the objects of the invention, a method of separating a through-hole via interconnect wafer from a sacrificial wafer is achieved. A wafer is provided having through-holes therein to form a through-hole via interconnect wafer. A substrate of a sacrificial wafer is provided. The substrate is coated with any polymer having low adhesion to metals such as a lift-off polymer. A conductive layer is deposited on the polymer. A photoresist layer is coated on the conductive layer. The through-hole via wafer is bonded to the sacrificial wafer wherein the photoresist layer provides the bonding. The photoresist exposed in the through-holes is developed away to expose the conductive layer. The through-holes vias are filled with conductive material by electroplating the conductive layer exposed through the vias. The photoresist is stripped in a high frequency agitation bath wherein the photoresist separates from the through-hole wafer and wherein the filled through-hole wafer separates from the underlying polymer at an interface between the polymer and the conductive layer to complete separation of the through-hole via wafer from the sacrificial wafer.

BRIEF DESCRIPTION OF THE DRAWINGS

In the accompanying drawings forming a material part of this description, there is shown.

DESCRIPTION OF THE PREFERRED EMBODIMENTS

Through-hole via and filling the via with a conductive material in a silicon substrate is a critical process for vertical integration of devices in wafer level packaging applications. Wafers with different functional chips can be integrated vertically using this method, eventually reducing the real estate and increasing the performance of the final product. Vertical integration or 3D packaging is increasing in usefulness as product size is shrinking, while a greater number of functional chips are required within the same area.

In a first embodiment of the present invention, a through-hole via wafer is fabricated and is used to connect with other wafers. A bottom-up filling approach is used in filling the via with a conductive material. For the bottom via filling method, a sacrificial wafer with a conductive layer is attached to the through-hole via wafer by a resist bonding method. An advantage of through-hole via filling by a bottom-up filling method is uniformity of via filling from the bottom side. Below the conducting layer, a polymer layer with low adhesion to metals such as a lift off polymer is used to have a low adhesion between the metal and the sacrificial wafer.

Figure 1:
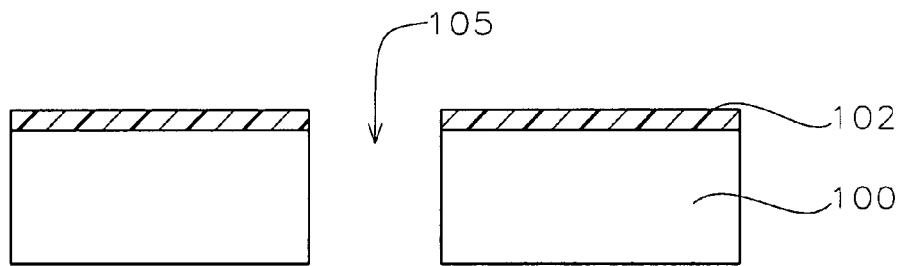
FIGS. 1 through 8 schematically illustrate in cross-sectional representation a first preferred embodiment of the present invention.

The detailed process flow of the first embodiment of the present invention will be described with reference to FIGS. 1-8. Referring now more particularly to FIG. 1, a wafer 100 is shown. Wafer 100 can be a passive substrate or may contain semiconductor device/MEMS/Optical/Bio structures, not shown. Through-holes 105 are etched through the wafer 100 using the photoresist pattern 102. The photoresist is removed.

Figure 2:
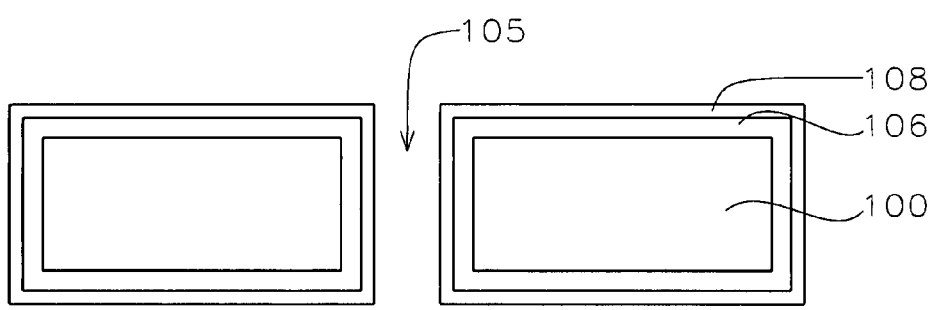

Now, an isolation layer 106 is formed on all sides of the wafer, including within the through-holes 105, as shown in FIG. 2. For example, the wafer may be oxidized to form an oxide layer 106. Typically, the oxide layer can be between 1-5 µm, but the actual thickness is tailored to the specific application. A barrier layer 108 is formed over the oxide layer 106 by plasma enhanced chemical vapor deposition (PECVD) or a low pressure CVD process. The barrier layer is deposited to serve as a copper diffusion barrier. The barrier material can be silicon nitride or any other alternate material such as titanium nitride, tantalum nitride etc.

Figure 3:
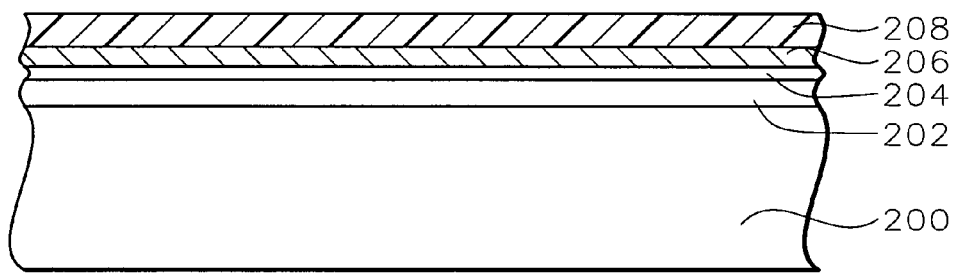

FIG. 3 illustrates the sacrificial wafer 200. The sacrificial wafer 200 preferably comprises silicon, glass, ceramic or organic material. In a key feature of the present invention, the sacrificial wafer 200 is prepared for bonding. A polymer layer 202 which has low adhesion to metals is coated on the top side of the wafer 200 to a thickness of about 4 µm, but not limited to this thickness. The polymer layer may comprise any type of material which has low adhesion to metals to enable it to separate easily from the through-hole interconnect wafer during a resist removal process with high frequency agitation.

In another key feature of the present invention, the sacrificial wafer is prepared for bottom-up via filling. An optional adhesion layer 204 is deposited over the polymer layer. This layer may comprise titanium, chromium or tantalum and have a thickness of between about 200 and 1000 Angstroms, but not limited to this thickness. Now, a conductive layer 206 is deposited over the optional adhesion layer. The conductive layer may comprise any conductive material such as copper, gold, nickel, and so on, and may have a thickness of between about 0.1 and 1.0 µm, but not restricted to this thickness. Finally, a positive photoresist layer 208 is coated over the conductive layer to a thickness of about, but not restricted to, 2 µm.

Figure 4:
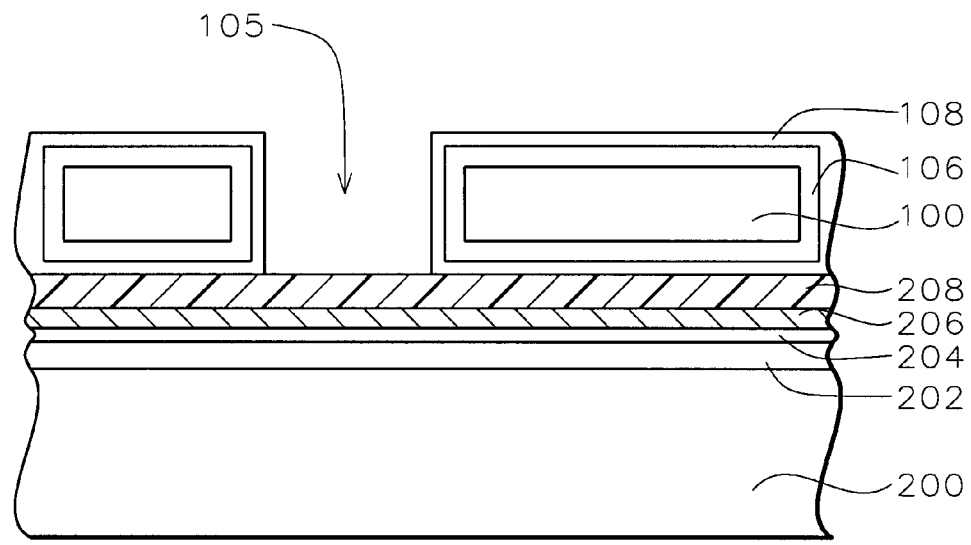
Figure 5:
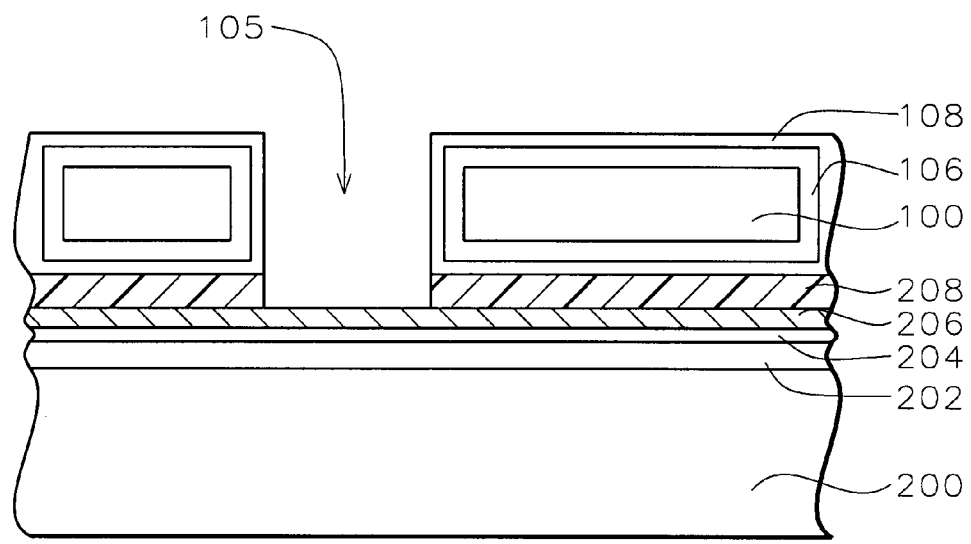

Referring now to FIG. 4, the photoresist 208 is used as an intermediate layer to bond the two wafers 100 and 200. The wafers are bonded at a temperature range from room temperature of 22° C. to 145° C. A heating device such as a hot plate oven, wafer to wafer bonder or any other bonding tool may be used. Now, the photoresist revealed at the bottom of the through-holes 105 is exposed in a proximity aligner. The photoresist is developed to remove the resist within the through-holes as shown in FIG. 5. The photoresist remaining is hard baked. This is to remove any solvent or moisture that might be absorbed by the photoresist.

Figure 6:
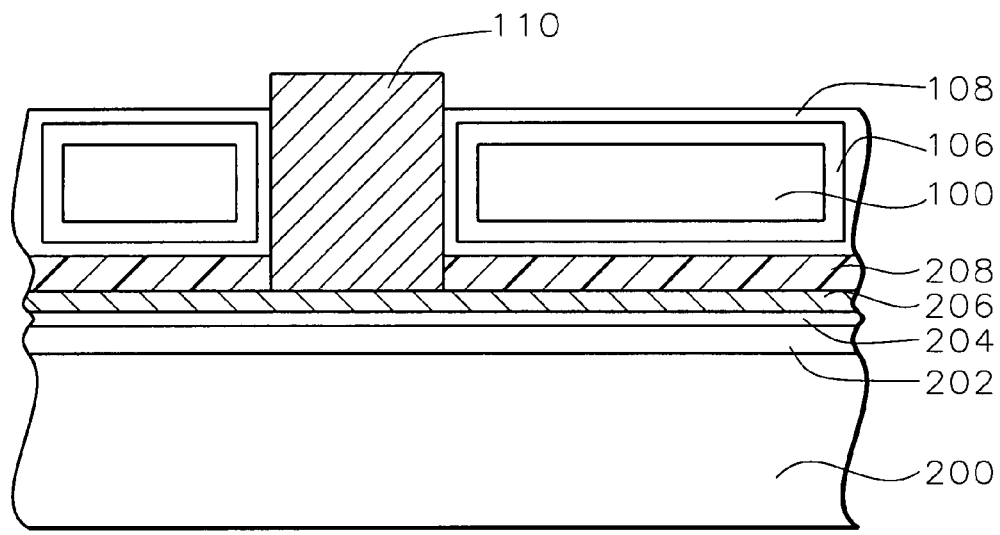

The bonded wafer is subjected to an electroplating or electroless plating process to fill the vias with a conductive material 110, as shown in FIG. 6. Conductive layer 110 is formed by electroplating or electroless plating using the conductive layer 206. Electroplating or electroless plating can take place on any conductive metal such as copper, gold, nickel, and so on.

Figure 7:
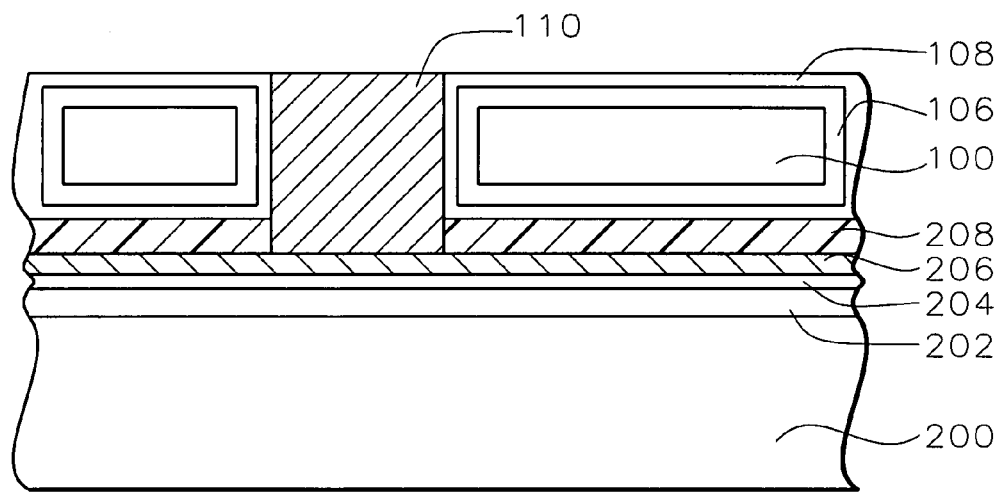

Now, the conductive layer 110 is planarized by any method such as grinding, polishing, chemical mechanical polishing (CMP), etching, etc. as illustrated in FIG. 7.

Now, the through-hole wafer is to be separated from the sacrificial wafer. A solvent resist strip process is applied, for example, in a high frequency agitation bath. For example, ultrasonic agitation may be used. Since the polymer 202 has low adhesion to metal, peel-off will occur easily at the point of contact at the via as shown by 215 in FIG. 8. High frequency agitation facilitates easy separation of the top wafer 100 from the sacrificial wafer 200 by tearing off at the interface.

Figure 8:
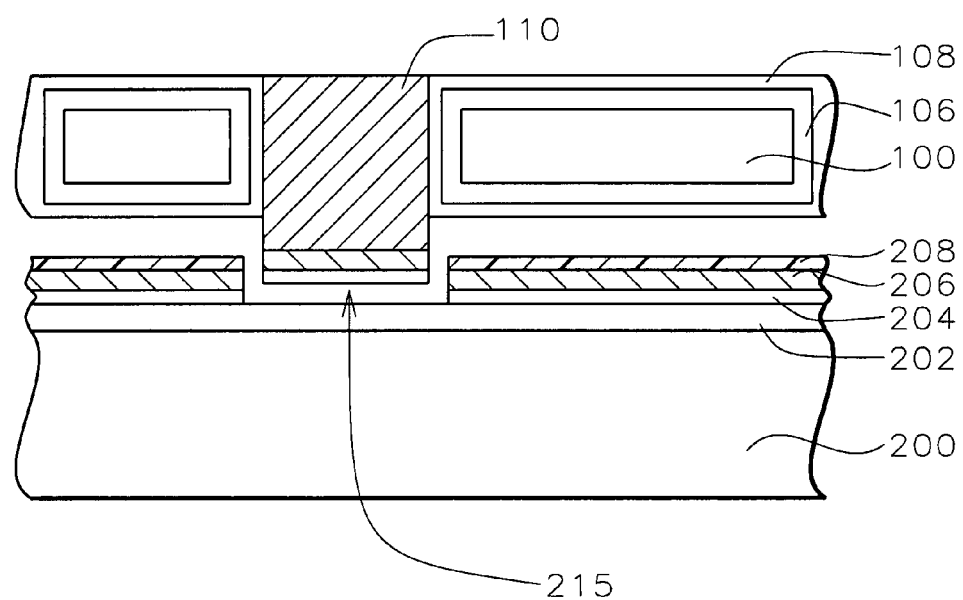

The method of the present invention focuses on the separation of the wafers after the through-hole vias are filled completely by the electroplating or electroless plating process. The conventional method of grinding away the sacrificial wafer is completely eliminated in this method. The resist removal solution (e.g. PRS 3000) softens the bonding between the sacrificial wafer 200 and the through-hole via wafer 100. A high frequency agitation bath such as Ultrasonic agitation bath further helps the resist stripping solvent such as PRS3000 solution to penetrate between the wafers and, at the same time, widens the gap between the wafers by imparting mechanical energy as shown in FIG. 8. Since the filled through-hole via is rooted to the conductive layer on the sacrificial wafer, separation takes place at the interface of the low-adhesion polymer and the conductive layer connected to copper-vias. When the through-hole via wafer 100 separates from the sacrificial wafer 200, a part of the conductive layer 204/206 debonds from the sacrificial wafer due to poor adhesion with the polymer 202. All the vias are separated from the sacrificial wafer 200 by this method and the whole sacrificial wafer is separated from the through-hole via wafer 100.

The process of the present invention can be extended to other applications such as transfer bonding of thin films and passive or active device structures to another substrate. The second embodiment of the present invention will be described with reference to FIGS. 9 through 13.

Figure 9:
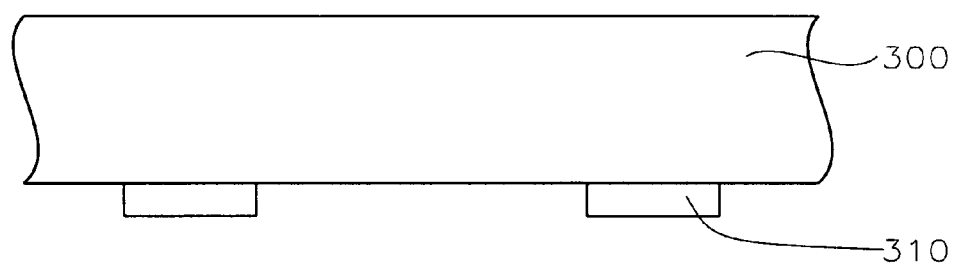
FIGS. 9 through 13 schematically illustrate in cross-sectional representation a second preferred embodiment of the present invention.

Referring now more particularly to FIG. 9, a target wafer 300 is shown. Thin structures are to be transferred from a sacrificial wafer to this target wafer 300. Wafer 300 can be a device wafer, a ceramic substrate, printed circuit board, flex film, and so on. If the target wafer is a device wafer or contains a device wafer as part of the substrate, it may be a passive substrate or may contain active semiconductor device/MEMS/Optical/Bio structures, not shown. Target regions 310 are shown where the thin structures are to be transferred.

Figure 10:
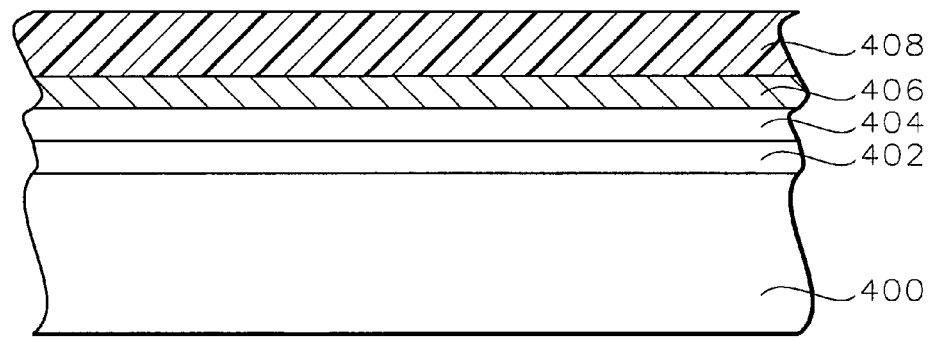

The sacrificial wafer 400, shown in FIG. 10, preferably comprises silicon, glass, ceramic or organic material. In a key feature of the present invention, the sacrificial wafer 400 is prepared for bonding. A polymer layer 402 which has low adhesion to metals is coated on the top side of the wafer 400 to a thickness of about 4 μm, but not limited to this thickness. The polymer layer may comprise any type of material which has low adhesion to metals to enable it to separate easily from the target wafer during a resist removal process with high frequency agitation. A conductive metal layer 406 is deposited over the polymer layer with low adhesion to metal. Optionally, an adhesion metal 404 such as Titanium can be deposited before depositing the metal 406. Now a positive photoresist layer 408 is coated over the conductive layer 406 to a thickness of about, but not restricted to, 2 μm. The photoresist is soft baked to remove any solvent or moisture that might be absorbed by the photoresist. The photoresist is patterned using a normal lithography process to provide openings to the conductive layer 406.

Figure 11:
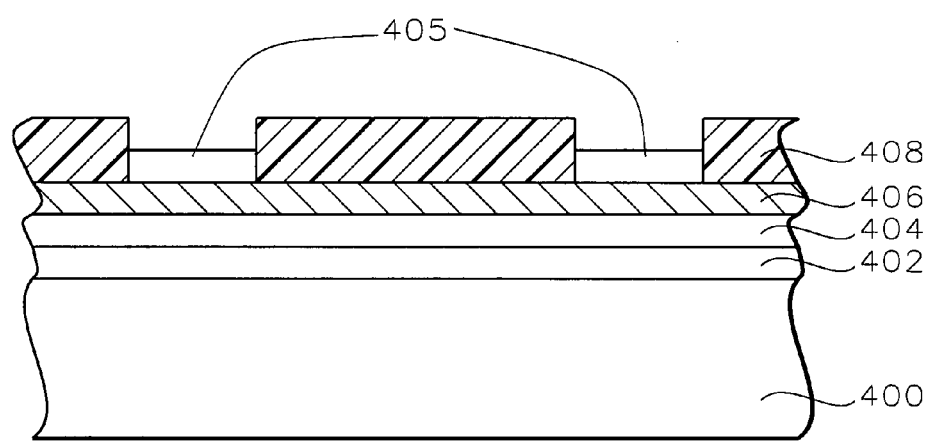

Structures 405 are formed on the sacrificial wafer as shown in FIG. 11. For example, these thin structures may be transducers, passive thin films, any active or passive device structures or a protective Cap layer in a MEMS wafer level packaging.

Figure 12:
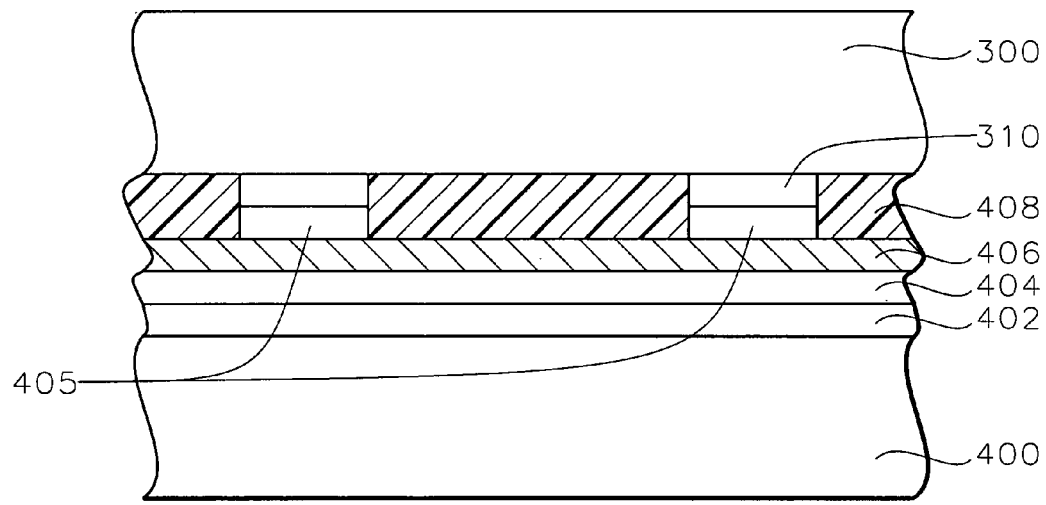
Figure 13:
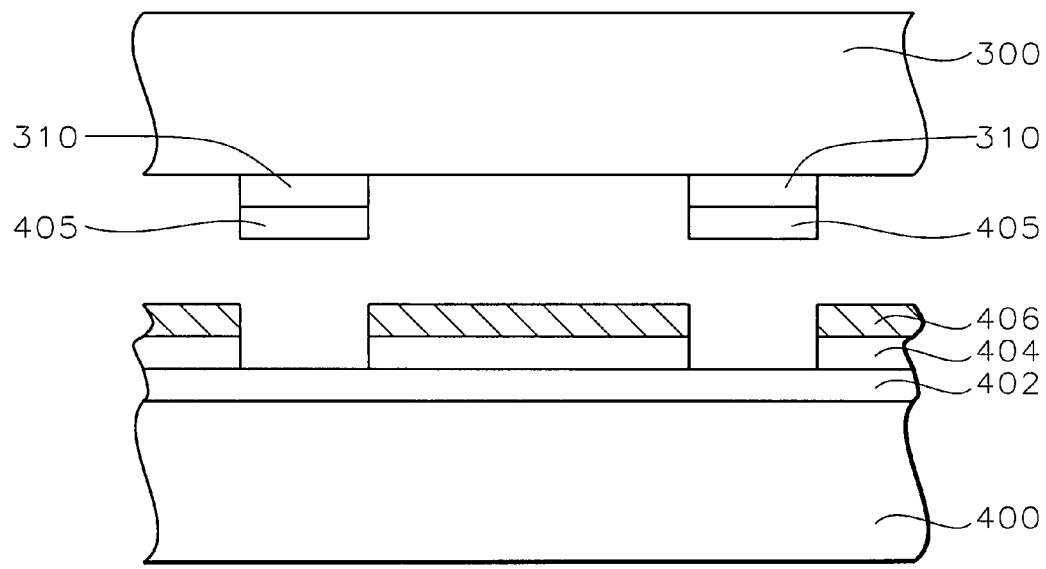

The photoresist 408 is used as an intermediate layer to bond the two wafers 300 and 400, as shown in FIG. 12. The wafers are bonded at a temperature range from room temperature of 22° C. to 145° C. A heating device such as a hot plate oven, wafer to wafer bonder or any other bonding tool may be used.

Now, the target wafer is to be separated from the sacrificial wafer. A solvent resist strip process is applied, for example, in a high frequency agitation bath. For example, ultrasonic agitation may be used. Since the polymer 402 has low adhesion to metal, peel-off will occur easily at the point of contact at the thin films and passive or active device structure shown in FIG. 13. High frequency agitation facilitates easy separation of the top wafer 300 from the sacrificial wafer 400 by tearing off at the interface. The adhesion/conductive layer 404/406 is removed after separation; for example, by a wet etch process.

While the invention has been particularly shown and described with reference to the preferred embodiments thereof, it will be understood by those skilled in the art that various changes in form and details may be made without departing from the spirit and scope of the invention.

What is claimed is:

1. A method of transfer bonding thin films and passive or active device structures to another substrate comprising:

providing a substrate having target transfer regions thereon;

providing a sacrificial wafer;

coating said sacrificial wafer with a polymer layer with low adhesion to metals;

coating a conductive layer on said polymer layer;

coating a photoresist layer over said conductive layer;

patterning said photoresist layer to provide openings to said conductive layer;

forming said thin film and passive or active device structures on said conductive layer within said openings;

bonding said substrate to said sacrificial wafer wherein said thin film and passive or active device structures and said photoresist layer provide said bonding and wherein said thin film and passive or active device structures contact said substrate at said target transfer regions; and stripping said photoresist in a high frequency agitation bath wherein said photoresist separates from said sacrificial wafer and wherein said thin film and passive or active device structures separate from said polymer layer at an interface between said polymer layer and said thin film and passive or active device structures to complete said transfer bonding of said thin films and passive or active device structures to said another substrate.

2. The method according to claim 1 wherein said substrate comprises a device wafer, a ceramic substrate, a printed circuit board, or a flex film substrate or a device wafer as a portion of a substrate.

3. The method according to claim 1 wherein said sacrificial wafer comprises silicon, glass, ceramic or organic material.

4. The method according to claim 1 wherein said polymer layer comprises a lift-off polymer.

5. The method according to claim 1 wherein said polymer is coated to a thickness of about 4 µm.

6. The method according to claim 1 further comprising forming an adhesion metal layer overlying said polymer layer and underlying said conductive layer.

7. The method according to claim 1 wherein said photoresist layer comprises a positive photoresist layer having a thickness of about 2 µm.

8. The method according to claim 1 wherein said thin film and passive or active device structures comprise one or more of transducers, passive thin films, any active or passive device structures or a protective Cap layer in a MEMS wafer level packaging.

9. The method according to claim 1 wherein said bonding comprises:

aligning said substrate and said sacrificial wafer; and bonding said substrate and said sacrificial wafer using a heating device such as a hot plate oven, wafer to wafer bonder or any other bonding tool.

10. The method according to claim 9 wherein said heating device heats said substrate and said sacrificial wafer to a temperature of between about 22 to 145° C.

11. The method according to claim 1 wherein said high frequency agitation bath comprises a resist solvent and ultrasonic agitation.

12. The method according to claim 1 after said stripping said photoresist further comprising removing said conductive layer not covered by said thin film and passive or active device structures using a wet etch process.

* * * * *

UNITED STATES PATENT AND TRADEMARK OFFICE
CERTIFICATE OF CORRECTION

| | |
|---|---|
| PATENT NO. | : 7,381,629 B2 |
| APPLICATION NO. | : 11/705480 |
| DATED | : June 3, 2008 |
| INVENTOR(S) | : Sankarapillai et al. |

It is certified that error appears in the above-identified patent and that said Letters Patent is hereby corrected as shown below:

On the Title page, in Item (63), delete "Continuation-in part of application No. 10/925,683, filed on Aug. 25, 2004, now Pat. No 7,183,176." and replace with -- Divisional of application No. 10/925,683, filed on Aug. 25, 2004, now Pat. No. 7,183,176 --.

Signed and Sealed this

Fifth Day of August, 2008

JON W. DUDAS
*Director of the United States Patent and Trademark Office*